United States Patent
Sato

(10) Patent No.: US 9,787,301 B2
(45) Date of Patent: Oct. 10, 2017

(54) SEMICONDUCTOR SWITCHING DEVICE

(71) Applicant: FUJI ELECTRIC CO., LTD., Kawasaki-shi (JP)

(72) Inventor: Tadahiko Sato, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/180,427

(22) Filed: Jun. 13, 2016

(65) Prior Publication Data

US 2017/0019097 A1    Jan. 19, 2017

(30) Foreign Application Priority Data

Jul. 17, 2015 (JP) ................................. 2015-142617

(51) Int. Cl.
| | |
|---|---|
| *H03B 1/00* | (2006.01) |
| *H03K 3/00* | (2006.01) |
| *H03K 17/567* | (2006.01) |
| *H01L 27/06* | (2006.01) |
| *H03K 17/12* | (2006.01) |
| H03K 17/16 | (2006.01) |

(52) U.S. Cl.
CPC ....... *H03K 17/567* (2013.01); *H01L 27/0635* (2013.01); *H03K 17/12* (2013.01); *H03K 17/163* (2013.01); *H03K 17/168* (2013.01); *H03K 2217/0036* (2013.01)

(58) Field of Classification Search
CPC ............................ H03K 17/567; H03K 17/687
USPC ................ 327/108–112, 427, 434, 437, 432, 327/440–442, 377, 376, 374, 379–384; 326/82, 83, 87
See application file for complete search history.

(56) References Cited

U.S. PATENT DOCUMENTS

2003/0189452 A1 * 10/2003 Honda .................... H03K 5/133
327/276
2009/0289691 A1 * 11/2009 Fuller .................. H03K 17/166
327/432

(Continued)

FOREIGN PATENT DOCUMENTS

| JP | H04-354156 A | 12/1992 |
|---|---|---|
| JP | 2002-165439 A | 6/2002 |
| JP | 2012-253202 A | 12/2012 |

(Continued)

*Primary Examiner* — Thomas Skibinski
(74) *Attorney, Agent, or Firm* — Rabin & Berdo, P.C.

(57) ABSTRACT

Provided is a semiconductor switching device such that there is a reduction in surge or loss in multiple kinds of semiconductor switching element provided in parallel and of differing turn-on/turn-off operation characteristics. The semiconductor switching device includes a switching circuit unit that includes in parallel multiple kinds of semiconductor switching element having different turn-on/turn-off operation characteristics and turns a main current on and off, a driver circuit that includes a current source terminal and a current sink terminal and outputs drive signals that collectively turn the semiconductor switching elements on and off from the current source terminal and the current sink terminal, and an impedance element that is interposed between the current source terminal and the current sink terminal in the driver circuit and causes timings of operations by which the semiconductor switching elements are turned on and off to differ from each other.

26 Claims, 7 Drawing Sheets

(56) References Cited

U.S. PATENT DOCUMENTS

2012/0280728 A1* 11/2012 Hussein ............... H03K 17/127
  327/155
2014/0184303 A1   7/2014 Hasegawa et al.

FOREIGN PATENT DOCUMENTS

JP    2014-130909 A    7/2014
WO   WO 2016-199360 A1   12/2016

* cited by examiner

SEMICONDUCTOR SWITCHING DEVICE

BACKGROUND OF THE INVENTION

1. Field of the Invention

The present invention relates to a power semiconductor device made up of multiple kinds of semiconductor switching elements, for an example an insulated-gate bipolar transistor (IGBT) and a metal oxide semiconductor field effect transistor (MOSFET), with differing turn on/turn off operation characteristics being provided in parallel, and in particular, relates to a semiconductor switching device with a simple configuration such that surge or switching loss occurring when the multiple kinds of semiconductor switching elements are turned on and off can be reduced.

2. Description of the Background Art

A switching power supply device such as a DC-DC converter or a power conversion device, such as an inverter, that drives a motor is made up of a power semiconductor element such as an IGBT or MOSFET as a semiconductor switching element for switching input power. Also, with regard to this kind of semiconductor switching device, there is strong demand for surge or switching loss occurring when the power semiconductor element is turned on and off to be reduced.

To date, in order to satisfy this kind of demand, using an IGBT, which has barrier layer voltage and in which voltage drop in a large current region is small, and a MOSFET, which has a constant resistance characteristic, in parallel has been proposed as the power semiconductor element.

The barrier layer voltage refers to voltage that does not cause current to flow in a low voltage region C, as shown in IGBT voltage-current characteristic A in FIG. 7. Also, the constant resistance characteristic is a characteristic that causes current in accordance with the on-state resistance of a semiconductor element (such as a MOSFET) to flow from when a voltage $V_{DS}$ applied to the MOSFET is zero until the voltage $V_{DS}$ becomes a predetermined voltage, as shown in MOSFET voltage-current characteristic B in FIG. 7.

A semiconductor switching device configured using the IGBT and MOSFET in parallel may be configured so that input power is turned on and off (input power is switched) utilizing the constant resistance characteristic of the MOSFET in a low current region and utilizing mainly the low voltage drop characteristic of the IGBT in a high current region. According to the semiconductor switching device with this kind of configuration, low-loss switching is realized with respect to changes in load powers of low currents to high currents, whereby more efficient power conversion can be achieved. That is, the semiconductor switching device with the heretofore described configuration is such that switching loss in the IGBT, which has a long turn-off time, is reduced by controlling timing so that the MOSFET is turned on prior to the timing at which the IGBT is turned off.

JP-A-4-354156 describes providing a difference between the resistance values of gate resistors provided between the gate of each of an IGBT and a MOSFET provided in parallel and an output terminal. Also, JP-A-2002-165439 describes technology whereby switching loss is reduced by an IGBT and MOSFET provided in parallel as switching elements being such that the turn-on timing of the IGBT is shifted so as to be later than the turn-on timing of the MOSFET when the switching elements are turned on, and the turn-off timing of the MOSFET is shifted so as to be later than the turn-off timing of the IGBT when the switching elements are turned off.

Specifically, when applying the technology disclosed in either JP-A-4-354156 or JP-A-2002-165439, the resistance value of a gate resistor corresponding to a MOSFET can be greater than the resistance value of the gate resistor corresponding to the IGBT.

According to a circuit that provides a difference between the resistance values of the gate resistors in this way, the turn-on timings and turn-off timings of the IGBT and MOSFET can be adjusted. Specifically, the MOSFET can be turned off after the IGBT is first turned off by the first gate drive voltage output from a driver circuit.

Conversely, the IGBT can be turned on after the MOSFET is turned on by the second gate drive voltage output from the driver circuit by the resistance value of the gate resistor corresponding to the MOSFET being smaller than the resistance value of the gate resistor corresponding to the IGBT. As a result of this, switching loss when the switch made up of the IGBT and MOSFET is turned on can be reduced.

However, in the examples described above, switching loss can only be reduced either when the semiconductor switching elements are turned on or when the semiconductor switching elements are turned off, and switching loss cannot be reduced both when the semiconductor switching elements are turned on and when the semiconductor switching elements are turned off.

Alternatively, resistors of resistance values smaller than those of the gate resistors may be provided in parallel to the gate resistors respectively via diodes. The configuration can also be such that the resistors with the smaller gate resistance act via the diodes only when the switch is turned on or only when the switch is turned off.

According to a circuit configured in this way, the first gate drive voltage output from the driver circuit may be applied promptly to the gate of the MOSFET via a resistor with the smaller resistance value, after which the first gate drive voltage output can be applied to the gate of the IGBT via a gate resistor with a greater resistance value. Also, the second gate drive voltage output from the driver circuit may be applied promptly to the gate of the IGBT via a resistor with a smaller resistance value, after which the second gate drive voltage output can be applied to the gate of the MOSFET via a gate resistor with the greater resistance value.

In this case, however, there are two resistors and two extra diodes, because of which the circuit configuration is relatively complex, and the manufacturing cost increases.

In another example, two driver circuits may be provided in parallel corresponding to the IGBT and MOSFET respectively. However, in such a configuration, the circuit configuration is complex and the manufacturing cost increases.

SUMMARY OF THE INVENTION

Herein, when adjusting the timings of the actions of turning the IGBT and MOSFET on and off, it is necessary to consider variation in the element characteristics of the IGBT and MOSFET, and operational threshold temperature characteristics, when setting the resistance values of gate resistors and the like. Also, in order to attempt optimization of the timings of the IGBT and MOSFET operations, taking into account fluctuation factors caused by these kinds of element characteristic, it is necessary, for example, to increase the operational threshold of the IGBT and reduce the operational threshold of the MOSFET by modifying the element structure of each of the IGBT and MOSFET, or the like.

However, when increasing the operational threshold of the IGBT, the first gate drive voltage needs to be sufficiently high to ensure proper operation. In a theoretical case wherein the first gate drive voltage is low, there is concern that the IGBT may not be able to be driven so as to be turned on. Also, when reducing the operational threshold of the MOSFET, the difference between the gate voltage and operational threshold when turning off the MOSFET decreases. In this case, the noise margin with respect to the MOSFET decreases, and there is concern that the MOSFET will malfunction due to noise superimposed on a gate drive signal.

Embodiments of the present invention, having been contrived considering this kind of situation, has an object of providing a semiconductor switching device of a simple configuration such that there can be a reduction in surge or switching loss occurring when multiple kinds of semiconductor switching element, formed of, for example, an IGBT and a MOSFET, provided in parallel are turned on and off.

In order to achieve the heretofore described object, a semiconductor switching device according to an aspect of the invention includes a switching circuit unit that includes in parallel multiple kinds of semiconductor switching elements, for example an IGBT and a MOSFET, having turn-on/turn-off operation characteristics and turns a main current on and off, a driver circuit that includes a current source terminal and a current sink terminal, outputs a first drive voltage necessary in order to turn on each of the semiconductor switching elements from the current source terminal in accordance with a control signal that controls the turning on and off of the main current and outputs a second drive voltage necessary in order to turn off each of the semiconductor switching elements from the current sink terminal in accordance with the control signal, and an impedance element that is interposed between the current source terminal and the current sink terminal in the driver circuit and causes timings of operations by which the semiconductor switching elements are turned on and off to differ from each other.

The driver circuit may be configured to include a first output switch circuit that outputs the first drive voltage from the current source terminal in accordance with the control signal and a second output switch circuit that outputs the second drive voltage from the current sink terminal in accordance with the control signal.

Herein, the first drive voltage is a high potential gate drive voltage necessary in order to turn on the multiple kinds of semiconductor switching element, and the second drive voltage is a low potential gate drive voltage which is lower than the first drive voltage and is necessary in order to turn off the multiple kinds of semiconductor switching element.

Specifically, a first semiconductor switching device according to an aspect of the invention includes a timing adjustment resistance element as an impedance element, interposed between the current source terminal and current sink terminal in the driver circuit, that causes timings of operations by which the first and second semiconductor switching elements are turned on and off to differ from each other.

The driver circuit may include a first output switch circuit that outputs the first drive voltage to the current source terminal in accordance with the control signal, a second output switch circuit that outputs the second drive voltage, in an opposite manner to the first output switch circuit, to the current sink terminal in accordance with the control signal, and furthermore, a third output switch circuit that outputs the second drive voltage, in the opposite manner to the first output switch circuit, to the current source terminal in accordance with the control signal.

Herein, the third output switch circuit is configured so as to output the second drive voltage, necessary in order to turn off the first semiconductor switching element, to the current source terminal before the first semiconductor switching element is turned off with outputting of the second drive voltage from the current sink terminal.

Alternatively, the third output switch circuit may be configured so as to maintain the first semiconductor switching element in an off-state by outputting the second drive voltage from the current source terminal after the first semiconductor switching element is turned off with outputting the second output switch circuit being turned on.

Also, a second semiconductor switching device according to an aspect of the invention includes a switching circuit unit that turns a main current on and off by including in parallel first and second semiconductor switching elements, for example an IGBT and a MOSFET, having different turn-on/turn-off operation characteristics, a first driver circuit that outputs a drive voltage that turns the first semiconductor switching element on and off from a first output terminal in accordance with a control signal that controls the turning on and off of the first and second semiconductor switching elements, a second driver circuit that outputs a drive voltage that turns the second semiconductor switching element on and off from a second output terminal in accordance with the control signal, and a timing adjustment capacitive element that is interposed between the first output terminal included in the first driver circuit and the second output terminal included in the second driver circuit and causes timings of operations by which the first and second semiconductor switching elements are turned on and off to differ from each other.

According to one embodiment, the first driver circuit includes a first switch circuit, which outputs a first drive voltage necessary in order to turn on the first semiconductor switching element from the first output terminal in accordance with the control signal, and a second switch circuit, which outputs a second drive voltage necessary in order to turn off the first semiconductor switching element from the first output terminal in place of the first drive voltage, and the second driver circuit is configured to include a third switch circuit, which outputs a third drive voltage necessary in order to turn on the second semiconductor switching element from the second output terminal in accordance with the control signal, and a fourth switch circuit, which outputs a fourth drive voltage necessary in order to turn off the second semiconductor switching element from the second output terminal in place of the third drive voltage.

Herein, the first drive voltage is a high potential gate drive voltage necessary in order to turn on the first semiconductor switching element, and the second drive voltage is a low potential gate drive voltage which is lower than the first drive voltage and is necessary in order to turn off the first semiconductor switching element. Furthermore, the third drive voltage is a high potential gate drive voltage necessary in order to turn on the second semiconductor switching element, and the fourth drive voltage is a low potential gate drive voltage which is lower than the third drive voltage and is necessary in order to turn off the second semiconductor switching element.

The third switch circuit may be configured so as to output the third drive voltage to the output terminal of the second driver circuit via a backflow preventing diode that prevents a backflow of a charge accumulated in the timing adjustment capacitive element. Also, the timing adjustment capacitive element is provided so as to be capable of being selectively cut off from between the output terminals of the first and second driver circuits via a fifth switch circuit.

The semiconductor switching device according to embodiments of the invention is such that a current source terminal for outputting a first drive voltage necessary in order to turn on each of multiple kinds of semiconductor switching element (for example, an IGBT and a MOSFET) provided in parallel, and a current sink terminal for outputting a second drive voltage necessary in order to turn off each of the semiconductor switching elements, are provided independently in a driver circuit that outputs drive voltage that turns the semiconductor switching elements on and off. Further, timings of operations by which the semiconductor switching elements are turned on and off can be caused to differ from each other simply by employing a simple configuration wherein an impedance element is interposed between the current source terminal and current sink terminal.

In particular, simply by using a timing adjustment resistance element as the impedance element, a difference can be provided between times needed until the first drive voltage output from the current source terminal and the second drive voltage output from the current sink terminal are applied to control terminals (gates) of the respective semiconductor switching elements. In other words, the voltages applied to the control terminals (gates) of the respective semiconductor switching elements are such that a difference can be provided between the time needed until reaching the first drive voltage output from the current source terminal and the time needed until reaching the second drive voltage output from the current sink terminal. As a result of this, the timings of operations by which the semiconductor switching elements is turned on and off can be easily and reliably caused to differ without changing the operational thresholds of the semiconductor switching elements, because of which surge or switching loss occurring when the semiconductor switching elements are turned on and off can be effectively reduced, despite the configuration being simple.

Also, when using first and second driver circuits for turning on and off each of the multiple kinds of semiconductor switching element (for example, an IGBT and a MOSFET), the timings of turning the semiconductor switching elements on and off can easily be caused to differ by utilizing charging and discharging of a timing adjustment capacitive element, simply by interposing the timing adjustment capacitive element between output terminals of the driver circuits.

Specifically, by utilizing the charging and discharging voltage of the timing adjustment capacitive element, for example, the drive voltage applied to the gate of the MOSFET can be higher than the first drive voltage output from the first driver circuit. In other words, the drive voltage applied to the gate of the IGBT can be lower than the drive voltage applied to the gate of the MOSFET. As a result of this, the MOSFET can reliably be turned on before the IGBT is turned on, and the MOSFET can be turned off after the IGBT is turned off. Consequently, the timings of operations by which the IGBT and MOSFET are turned on and off can be caused to differ while adopting a simple configuration wherein a timing adjustment capacitive element is interposed between the output terminals of the first and second driver circuits, whereby considerable practical advantages, such as enabling switching loss in the IGBT to be reliably reduced, are achieved.

DETAILED DESCRIPTION OF THE INVENTION

Figure 1:
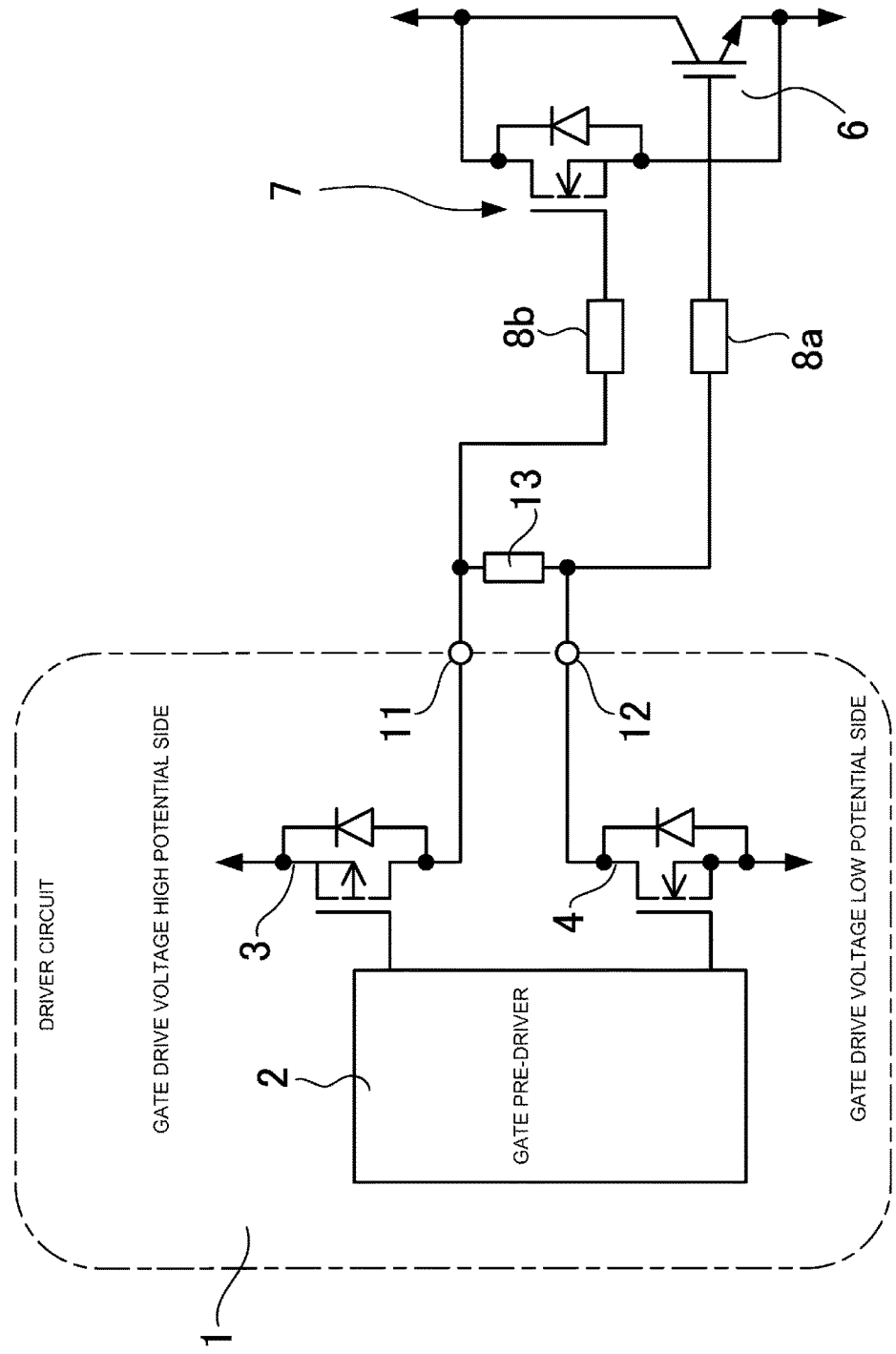
FIG. 1 is a main portion schematic configuration diagram of a semiconductor switching device according to a first embodiment of the invention.

Hereafter, referring to the drawings, a description will be given of a semiconductor switching device according to embodiments of the invention, with a device that switches main current using an IGBT and MOSFET in parallel as multiple kinds of semiconductor switching element as an example.

FIG. 1 is a main portion schematic configuration diagram of a semiconductor switching device according to a first embodiment of the invention, wherein reference sign 6 is an IGBT, and reference sign 7 is a MOSFET provided in parallel with the IGBT 6. Also, 8a and 8b in FIG. 1 are gate resistors connected to gates of the IGBT 6 and MOSFET 7 respectively.

As shown in the main portion schematic configuration diagram of FIG. 1, characteristics of the semiconductor switching device according to the first embodiment are that a current source terminal 11, which outputs a first drive voltage for turning the IGBT 6 and MOSFET 7 on, and a current sink terminal 12, which outputs a second drive voltage for turning the IGBT 6 and MOSFET 7 off, are provided separately and independently from each other as drive voltage output terminals of a driver circuit 1 that turns each of the IGBT 6 and MOSFET 7 on and off, and that a timing adjustment resistance element 13 is interposed between the current source terminal 11 and current sink terminal 12.

Herein, a gate of the MOSFET 7 is connected via the gate resistor 8b to the current source terminal 11, and a gate of the IGBT 6 is connected via the gate resistor 8a to the current sink terminal 12.

That is, the driver circuit 1 in the semiconductor switching device according to the first embodiment of the invention includes the current source terminal 11 and current sink terminal 12, as shown in FIG. 1. The current source terminal 11 performs a role of outputting the first drive voltage for turning the IGBT 6 and MOSFET 7 on in accordance with a control signal output by a gate pre-driver 2. Also, the current sink terminal 12 performs a role of outputting the second drive voltage for turning the IGBT 6 and MOSFET 7 off in accordance with a control signal output by the gate pre-driver 2.

Herein, the first drive voltage is a high potential gate drive voltage necessary in order to turn on each of the IGBT 6 and MOSFET 7, and is output to the current source terminal 11 via a first output switch circuit. The first output switch circuit is interposed between a predetermined high potential side power supply and the current source terminal 11, and is made up of a first switch element 3 that is turned on and off by receiving a control signal output by the gate pre-driver 2.

That is, in FIG. 1, the first switch element 3 makes up the first output switch circuit for outputting the first drive voltage in accordance with the control signal.

Also, the second drive voltage is a gate drive voltage, of a potential lower than that of the first drive voltage, necessary in order to turn off each of the IGBT 6 and MOSFET 7, and is output to the current sink terminal 12 via a second output switch circuit. The second output switch circuit is interposed between a predetermined low potential side power supply, specifically, for example, a ground potential, and the current source terminal 11, and is made up of a second switch element 4 that is turned on and off by receiving a control signal output by the gate pre-driver 2. In other words, in FIG. 1, the second switch element 4 makes up the second output switch circuit for outputting the second drive voltage, in an opposite manner to the first drive voltage, in accordance with the control signal.

The driver circuit 1 configured to include this kind of current source terminal 11 and current sink terminal 12 corresponds to a circuit wherein the first and second switch elements 3 and 4 connected in series in the existing driver circuit 1 shown in each of FIGS. 8 and 10 are separated, and voltage output sides of the first and second switch elements 3 and 4 are connected individually to the current source terminal 11 and current sink terminal 12 respectively.

Further, the gate of the MOSFET 7 is connected via the gate resistor 8b to the current source terminal 11, and the gate of the IGBT 6 is connected via the gate resistor 8a to the current sink terminal 12. Furthermore, the timing adjustment resistance element 13 is interposed between the current source terminal 11 and current sink terminal 12. As a result of this, the gate of the MOSFET 7 is connected to the current sink terminal 12 via the serial connection of the gate resistor 8b and timing adjustment resistance element 13. Also, the gate of the IGBT 6 is connected to the current source terminal 11 via the serial connection of the gate resistor 8a and timing adjustment resistance element 13.

According to the semiconductor switching device configured in this way, the first drive voltage is applied via the first switch element 3 to the current source terminal 11 when the IGBT 6 and MOSFET 7 are turned on in accordance with the control signal. Further, the first drive voltage applied to the current source terminal 11 is applied via the gate resistor 8b to the gate of the MOSFET 7, and is applied to the gate of the IGBT 6 via the serial connection of the timing adjustment resistance element 13 and gate resistor 8a.

As opposed to this, the second drive voltage is applied via the second switch element 4 to the current sink terminal 12 when the IGBT 6 and MOSFET 7 are turned off in accordance with the control signal. Further, the second drive voltage applied to the current sink terminal 12 is applied via the gate resistor 8a to the gate of the IGBT 6, and is applied to the gate of the MOSFET 7 via the serial connection of the timing adjustment resistance element 13 and gate resistor 8b.

Figure 2:
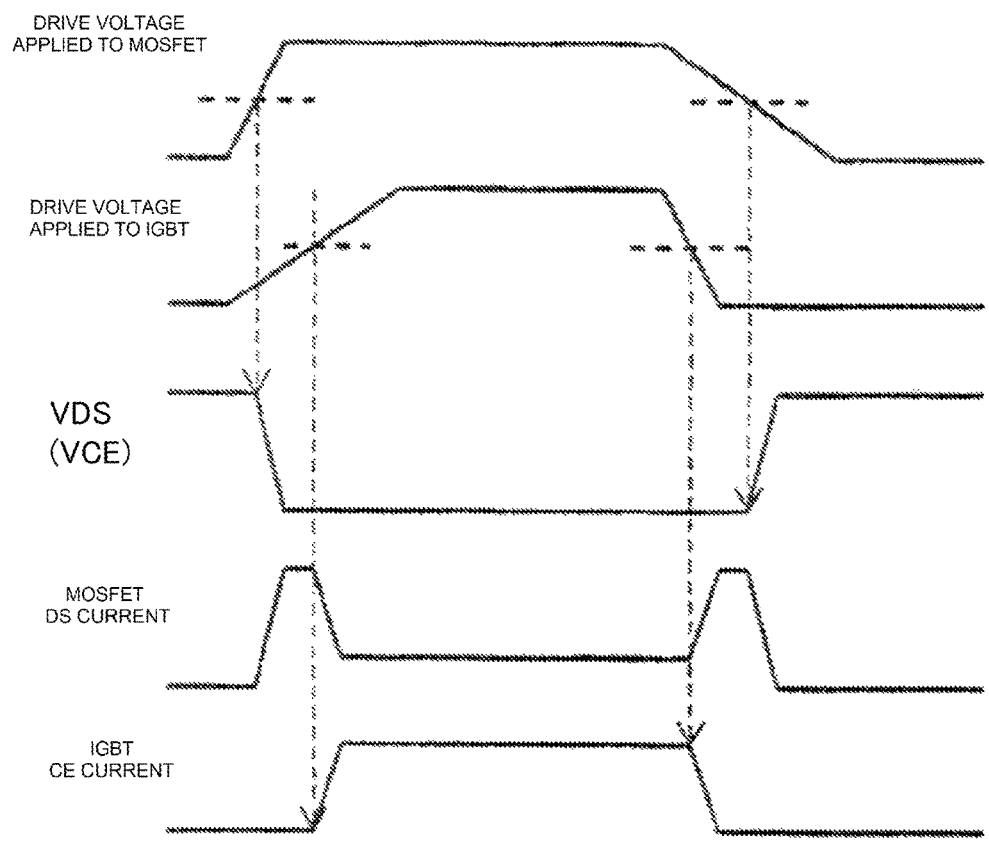
FIG. 2 is a diagram showing a schematic operation of the semiconductor switching device shown in FIG. 1.

The first drive voltage and second drive voltage applied to the gate of each of the IGBT 6 and MOSFET 7 change with a predetermined time delay, as shown in FIG. 2. That is, the drive voltage applied to the gate of the MOSFET 7 when the IGBT 6 and MOSFET 7 are turned on rises more sharply than the drive voltage applied to the gate of the IGBT 6. Also, the drive voltage applied to the gate of the MOSFET 7 when the IGBT 6 and MOSFET 7 are turned off falls more gently than the drive voltage applied to the gate of the IGBT 6.

As a result of this, the IGBT 6 is turned on after the MOSFET 7 is turned on by an output of the first drive voltage via the current source terminal 11, and the MOSFET 7 is turned off after the IGBT 6 is turned off by an output of the second drive voltage via the current sink terminal 12, as shown in FIG. 2. Consequently, a predetermined time difference can be provided in the timings of the turn on/turn off operations of the IGBT 6 and MOSFET 7 using the timing adjustment resistance element 13, whereby switching loss in the IGBT 6 can be reliably reduced without changing the operational thresholds of the IGBT 6 and MOSFET 7 by, for example, modifying the element structure.

Moreover, a large practical advantage is achieved in that switching loss in the IGBT 6 and MOSFET 7 provided in parallel can be reliably reduced, while the IGBT 6 and MOSFET 7 are stably driven so as to be turned on and off, using a simple configuration wherein the timing adjustment resistance element 13 is interposed between the current source terminal 11 and current sink terminal 12.

Figure 3:
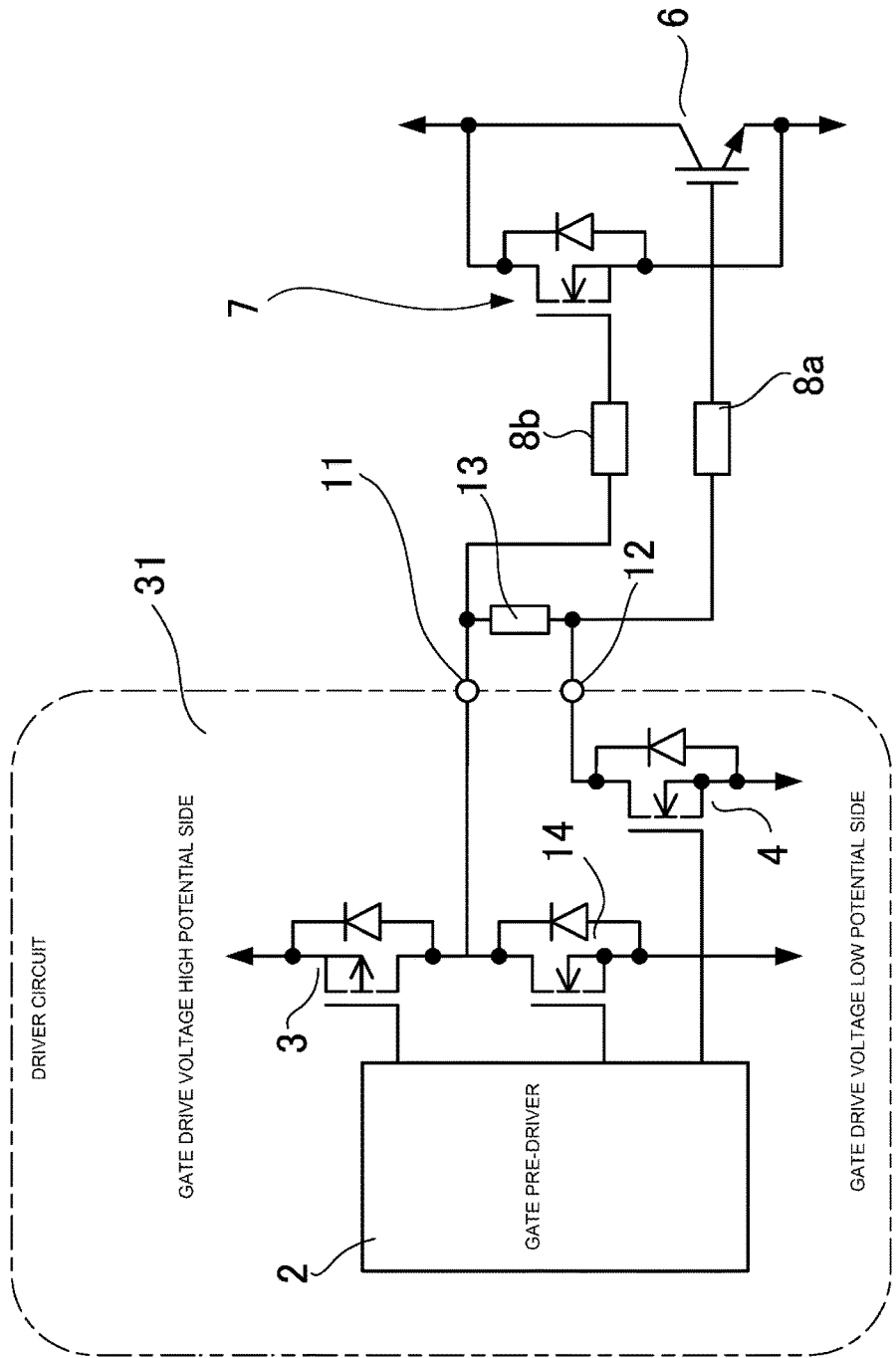
FIG. 3 is a main portion schematic configuration diagram of a semiconductor switching device according to a second embodiment of the invention.

Next, referring to FIG. 3, a description will be given of a semiconductor switching device according to a second embodiment of the invention. The semiconductor switching device according to the second embodiment is such that a third output switch circuit, which outputs the second drive voltage to the current source terminal 11 in an opposite manner to the first output switch circuit in accordance with the control signal, is further provided in the driver circuit 1 of the configuration shown in FIG. 1. In other words, the driver circuit 31 of FIG. 3 further includes a third output switch circuit, made up of a third switch element 14. The third output switch circuit, in the same way as the second output switch circuit configured as the second switch element 4, is made up of the third switch element 14 that is turned on by receiving a control signal output by the gate pre-driver 2 when the IGBT 6 and MOSFET 7 are turned off.

Herein, the third switch element 14 is connected in series with the first switch element 3 configuring the first output switch circuit, and is provided between the first switch element 3 and the low potential side power supply that outputs the second drive voltage for turning the IGBT 6 and MOSFET 7 off. Consequently, the first drive voltage or second drive voltage is output to the current source terminal 11 via, selectively, the first output switch circuit (first switch element 3) or third output switch circuit (third switch element 14). Further, the second embodiment is also such that the timing adjustment resistance element 13 is interposed between the current source terminal 11 and current sink terminal 12.

Figure 4:
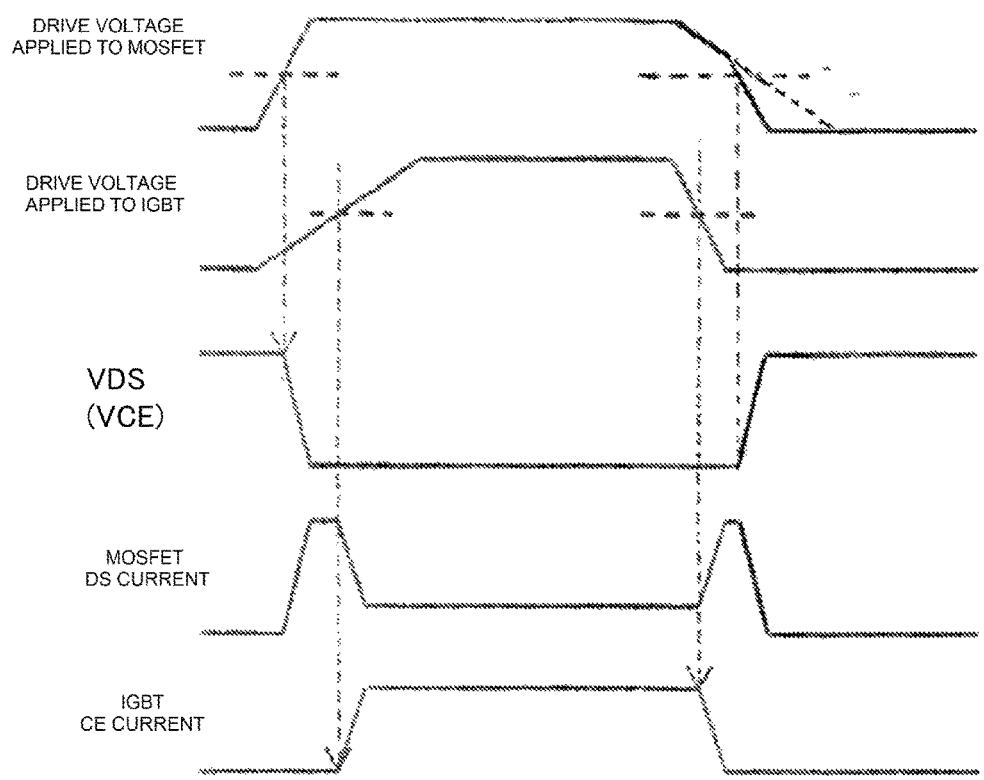
FIG. 4 is a diagram showing a schematic operation of the semiconductor switching device shown in FIG. 3.

According to the semiconductor switching device configured in this way, the MOSFET 7 can be forcibly turned off by the second drive voltage output from the current source terminal 11 with turning on of the third output switch circuit (made up of the third switch element 14) before the MOSFET 7 is turned off by the second drive voltage output from the current sink terminal 12 when the IGBT 6 and MOSFET 7 are turned off, as shown in FIG. 4.

In other words, by the third output switch circuit being turned on after the IGBT 6 is turned off by the second drive voltage output from the current sink terminal 12, the MOSFET 7 can be turned off by the second drive voltage output from the current source terminal 11 instead of the second drive voltage applied to the gate of the MOSFET 7 from the current sink terminal 12 via the timing adjustment resistance element 13. Also, the off-state of the MOSFET 7 can be stably maintained by the second drive voltage output from the current source terminal 11.

Consequently, when wishing to immediately turn off the MOSFET 7 together with the IGBT 6 when, for example, an abnormal state of the device such as a load short circuit is detected, both switches can be turned off promptly provided that the third output switch circuit is included. Further, the IGBT 6 and MOSFET 7 can be protected from short circuit current, and the semiconductor switching device itself can be effectively protected.

Next, referring to FIG. 5, a description will be given of another embodiment of the invention.

Figure 5:
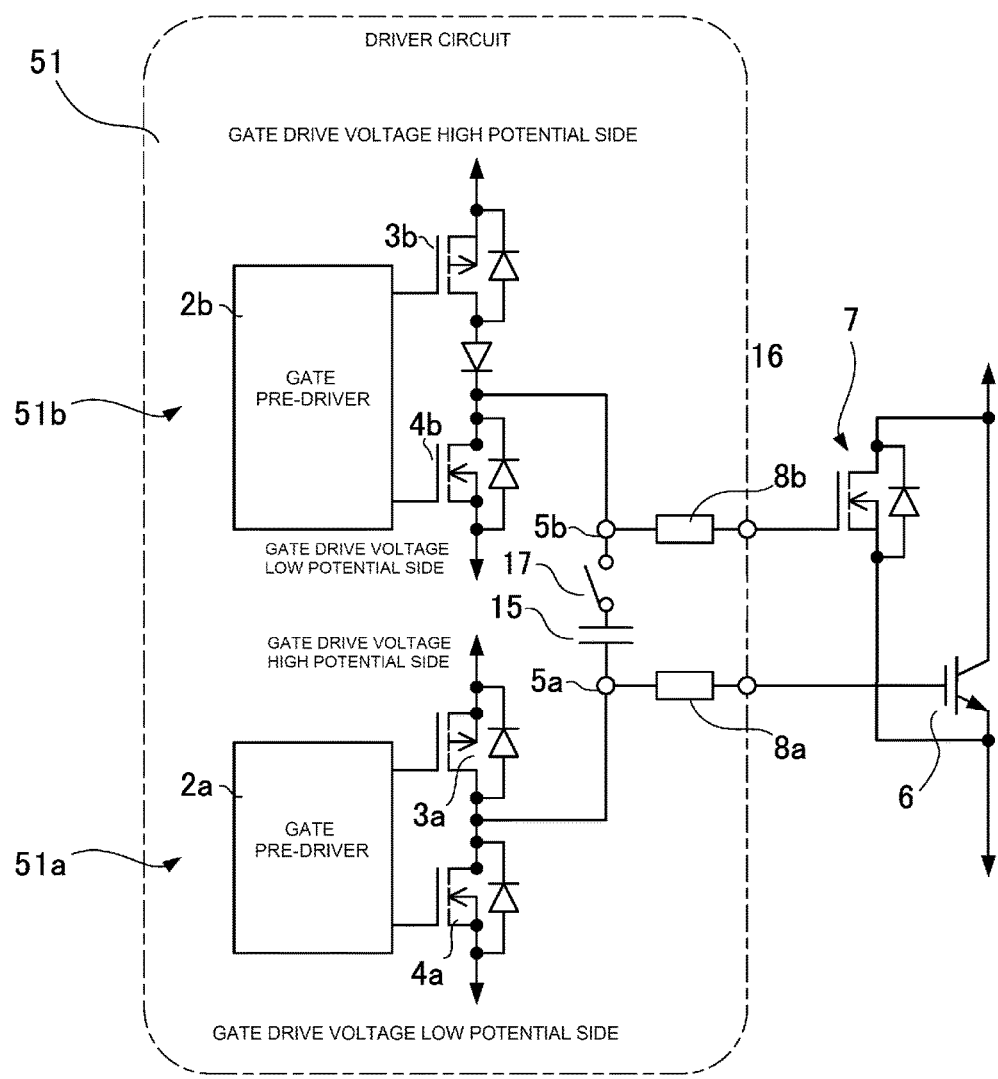
FIG. 5 is a main portion schematic configuration diagram of a semiconductor switching device according to a third embodiment of the invention.

FIG. 5 shows a main portion schematic configuration of a semiconductor switching device according to another embodiment of the invention. The semiconductor switching device according to this embodiment includes a driver circuit 51, including a first driver circuit 51a that outputs drive voltage that turns the IGBT 6 on and off in accordance with a control signal that controls the IGBT 6 and MOSFET 7, acting as first and second semiconductor switching elements provided in parallel, so as to be turned on and off, and a second driver circuit 51b that outputs drive voltage that turns the MOSFET 7 on and off in accordance with the control signal. The first and second driver circuits 51a and 51b may be realized integrated as one gate drive IC, as shown in, for example, FIG. 5.

Herein, the first driver circuit 51a is configured to include first and second switch elements 3a and 4a, which are connected in series and controlled by a first gate pre-driver 2a so as to be turned on and off in an opposite manner to each other. The first and second switch elements 3a and 4a are interposed between a high potential side power supply and low potential side power supply, and output gate drive voltage that turns the IGBT 6 on and off from a series connection point of the first and second switch elements 3a and 4a.

Specifically, the first switch element 3a in the first driver circuit 51a is formed of, for example, a p-channel MOSFET, and makes up a first switch circuit that outputs a high potential first gate drive voltage, necessary in order to turn on the IGBT 6, from the high potential side power supply to an output terminal 5a of the first driver circuit 51a. Also, the second switch element 4a connected in series with the first switch element 3a is formed of, for example, an n-channel MOSFET, and makes up a second switch circuit that outputs a low potential second gate drive voltage, necessary in order to turn off the IGBT 6, from the low potential side power supply to the output terminal 5a of the first driver circuit 51a.

Also, the second driver circuit 51b, in the same way as the first driver circuit 51a, is configured to include third and fourth switch elements 3b and 4b, which are connected in series and controlled by a second gate pre-driver 2b so as to be turned on and off in an opposite manner to each other. The third and fourth switch elements 3b and 4b, too, are interposed between a high potential side power supply and low potential side power supply, and output gate drive voltage that turns the MOSFET 7 on and off from a series connection point of the third and fourth switch elements 3b and 4b.

Specifically, the third switch element 3b in the second driver circuit 51b is formed of, for example, a p-channel MOSFET, and makes up a third switch circuit that outputs a high potential third gate drive voltage, necessary in order to turn on the MOSFET 7, from the high potential side power supply to an output terminal 5b of the second driver circuit 51b. Also, the fourth switch element 4b connected in series with the third switch element 3b is formed of, for example, an n-channel MOSFET, and makes up a fourth switch circuit that outputs a low potential fourth gate drive voltage, necessary in order to turn off the MOSFET 7, from the low potential side power supply to the output terminal 5b of the second driver circuit 51b.

The high potential side power supply that outputs the first gate drive voltage in the first driver circuit 51a and the high potential side power supply that outputs the third gate drive voltage in the second driver circuit 51b may output mutually differing voltages in accordance with the specifications of the IGBT 6 and MOSFET 7, or may output the same voltage. Also, the low potential side power supply that outputs the second gate drive voltage in the first driver circuit 51a and the low potential side power supply that outputs the fourth gate drive voltage in the second driver circuit 51b may also output differing voltages set in accordance with drive conditions of the IGBT 6 and MOSFET 7, or may output the same voltage. Herein, the second and fourth gate drive voltages output by the low potential side power supplies are generally set as ground voltages.

Herein, the first and second gate pre-drivers 2a and 2b turn the first and second switch elements 3a and 4a on and off in a complementary way, and turn the third and fourth switch elements 3b and 4b on and off in a complementary way, in accordance with the control signal that turns the IGBT 6 and MOSFET 7 on and off collectively.

Further, the first gate pre-driver 2a, when turning off the second switch element 4a together with turning on the first switch element 3a, outputs the high potential first gate drive voltage to the output terminal 5a of the first driver circuit 51a via the first switch element 3a. Also, the first gate pre-driver 2a, when turning off the first switch element 3a and turning on the second switch element 4a in place of the first switch element 3a, outputs the low potential second gate drive voltage to the output terminal 5a of the first driver circuit 51a via the second switch element 4a.

In the same way, the second gate pre-driver 2b, when turning off the fourth switch element 4b together with turning on the third switch element 3b, outputs the high potential third gate drive voltage to the output terminal 5b of the second driver circuit 51b via the third switch element 3b. Also, the second gate pre-driver 2b, when turning off the third switch element 3b and turning on the fourth switch element 4b in place of the third switch element 3b, outputs the low potential fourth gate drive voltage to the output terminal 5b of the second driver circuit 51b via the fourth switch element 4b.

The first or second gate drive voltage output from the output terminal 5a of the first driver circuit 51a in this way is applied to the gate of the IGBT 6 via the gate resistor 8a. Also, the third or fourth gate drive voltage output from the output terminal 5b of the second driver circuit 51b is applied to the gate of the MOSFET 7 via the gate resistor 8b.

In the semiconductor switching device according to this embodiment, a timing adjustment capacitive element 15 is interposed between the output terminal 5a of the first driver circuit 51a and the output terminal 5b of the second driver circuit 51b. The timing adjustment capacitive element 15 is charged and discharged in accordance with the first to fourth gate drive voltages output from the output terminals 5a and 5b, and performs a role of superimposing the charging voltage of the timing adjustment capacitive element 15 on the third or fourth gate drive voltage output from the output terminal 5b.

Specifically, when each of the second gate drive voltage and fourth gate drive voltage is of ground potential (0V), the timing adjustment capacitive element 15 performs a role of superimposing the first gate drive voltage on the third gate drive voltage when the first and third switch elements 3a and 3b are both turned on, thereby increasing the voltage of the output terminal 5b.

A backflow preventing diode 16 is serially interposed between the third switch element 3b and output terminal 5b. When the first gate drive voltage is superimposed on the third gate drive voltage via the timing adjustment capacitive element 15, and the voltage of the output terminal 5b is increased, the diode 16 performs a role of preventing the voltage from being regenerated via the third switch element 3b to the high potential side power supply in the second driver circuit 51b.

According to the semiconductor switching device configured to include the first driver circuit 51a that drives the IGBT 6 and the second driver circuit 51b that drives the MOSFET 7 in this way, the timings of the turn-on/turn-off operations of the IGBT 6 and MOSFET 7 can be set independently. In particular, by utilizing the charging and discharging of the timing adjustment capacitive element 15, the gate voltage applied to the gate of the MOSFET 7 from the output terminal 5b can be the sum of the first gate drive voltage output from the first driver circuit 51a and the third gate drive voltage output from the second driver circuit 51b.

Consequently, according to the semiconductor switching device wherein the timing adjustment capacitive element 15 is interposed between the output terminal 5a of the first driver circuit 51a and the output terminal 5b of the second driver circuit 51b, the gate voltage applied to the gate of the MOSFET 7 can be higher than the gate voltage applied to the gate of the IGBT 6. In other words, conversely, the gate voltage applied to the gate of the IGBT 6 can be lower than the gate voltage applied to the gate of the MOSFET 7. As a result of this, current flowing to the IGBT 6 when there is a short circuit operation can be suppressed by the amount by which the gate voltage of the IGBT 6 can be reduced, whereby the short circuit resistance of the IGBT 6 can be increased.

Figure 6:
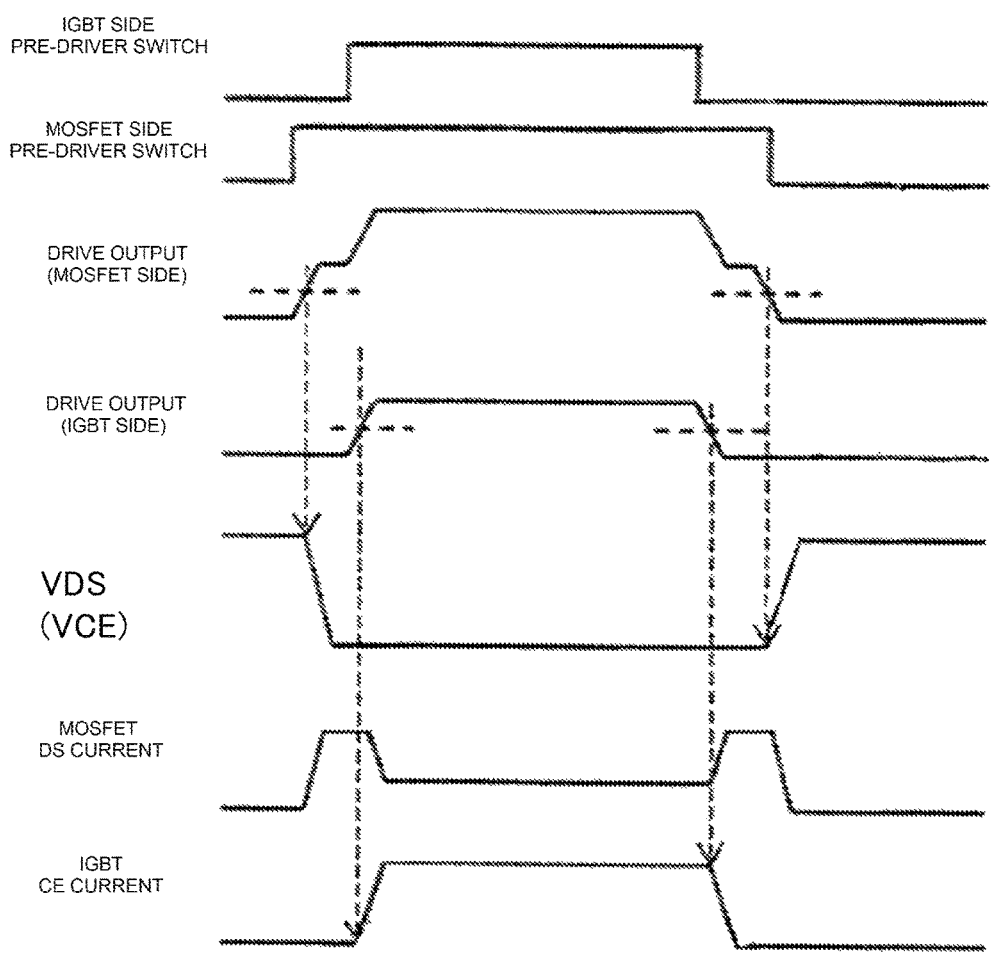
FIG. 6 is a diagram showing a schematic operation of the semiconductor switching device shown in FIG. 5.
Figure 7:
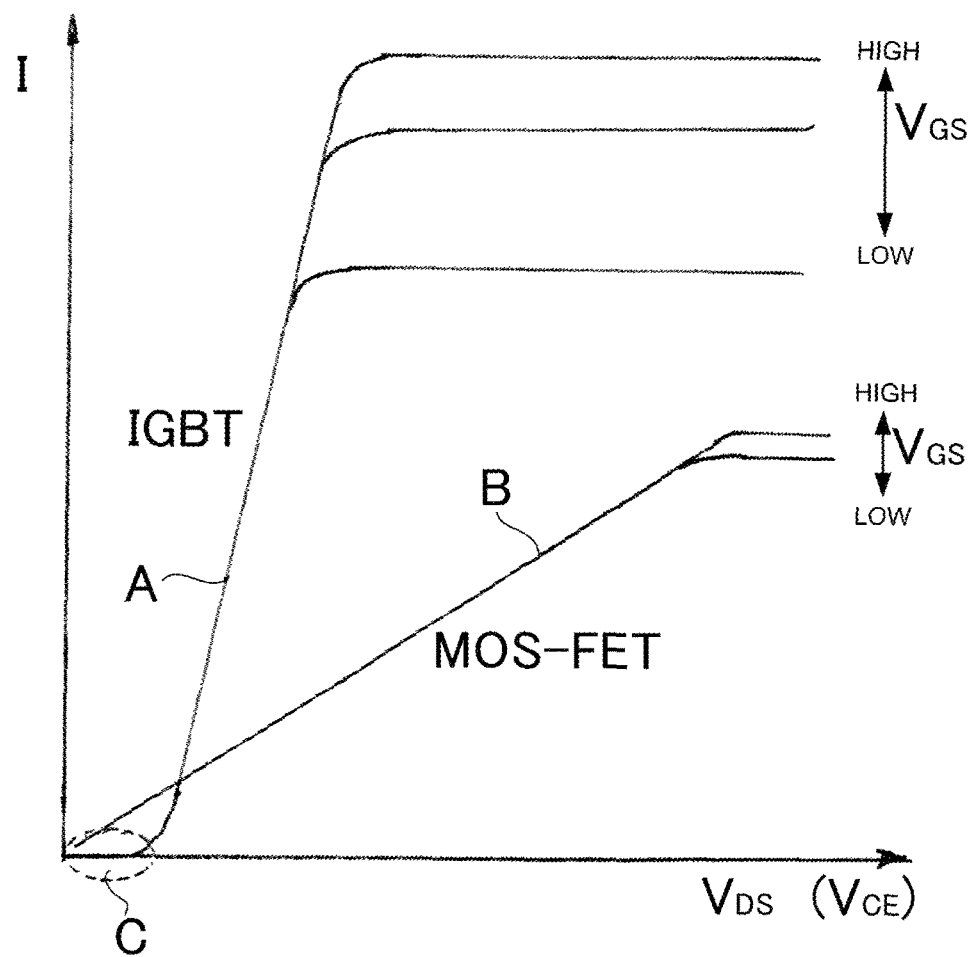
FIG. 7 is a diagram showing voltage-current characteristics of each of an IGBT and a MOSFET.

Specifically, when the IGBT 6 and MOSFET 7 are turned on, the third gate drive voltage is firstly output from the second driver circuit 51b prior to the first gate drive voltage being output from the first driver circuit 51a, as shown in an operation waveform example in FIG. 6. Further, together with the MOSFET 7 being turned on by the output of the third gate drive voltage, the timing adjustment capacitive element 15 is charged.

Subsequently, as shown in FIG. 6, the first gate drive voltage is output from the first driver circuit 51a, whereby the IGBT 6 is turned on. Thereupon, the voltage of the output terminal 5b of the second driver circuit 51b is increased via the timing adjustment capacitive element 15 together with the output of the first gate drive voltage, becoming the sum of the third gate drive voltage and first gate drive voltage. At this time, the voltage of the output terminal 5b increased to the sum of the third gate drive voltage and first gate drive voltage is prevented by the diode 16 from being regenerated to the high potential power supply of the second driver circuit 51b, and is applied to the gate of the MOSFET 7 via the gate resistor 8b.

Further, when the output of the first gate drive voltage from the first driver circuit 51a is stopped, the potential of the output terminal 5b is also pulled down via the timing adjustment capacitive element 15 by the voltage of the output terminal 5a becoming a low potential, as shown in FIG. 6. Subsequently, the second driver circuit 51b is turned off, and the potential of the output terminal 5b drops to a potential such that the MOSFET 7 is turned off.

That is, by voltage between the output terminals 5a and 5b being controlled via the timing adjustment capacitive element 15, turning on and off of the MOSFET 7 and IGBT 6 are controlled so that the IGBT 6 is turned on only when the MOSFET 7 is in an on-state, as shown in FIG. 6. As a result of this, the IGBT 6 can be turned on after the MOSFET 7 is turned on, and the MOSFET 7 can be turned off after the IGBT 6 is turned off, because of which switching loss in the IGBT 6 can be considerably reduced.

Furthermore, by the first switch element 3a being turned off in accordance with the state of the current flowing to the IGBT 6 and the second switch element 4a being maintained in an on-state, an unintended drive of the first driver circuit 51a can be stopped. Specifically, for example, unintended power consumption in the first driver circuit 51a can be reduced when a control signal of a pulse width such that turning on and turning off of the IGBT 6 cannot follow is applied, or in an operating mode at low current such that the characteristics of the IGBT 6 cannot be best utilized.

Herein, provided that the first gate drive voltage output by the first driver circuit 51a is set at or below the IGBT 6 turn-on operation threshold, and the sum of the first gate drive voltage and third gate drive voltage is set so as to exceed the MOSFET 7 turn-on operation threshold, the MOSFET 7 can be turned on and off without the IGBT 6 being turned on. Consequently, timing control whereby switching loss is reduced by the IGBT 6 being turned on after the MOSFET 7 is turned on with priority, and by the MOSFET 7 being turned off after the IGBT 6 is turned off with priority, can be easily implemented. Furthermore, by the high potential side power supply voltage in the first driver circuit 51a being lower than the high potential side power supply voltage in the second driver circuit 51b, an advantage is achieved in that the short circuit resistance of the IGBT 6 can be increased while increasing the saturation current of the MOSFET 7, and the like.

Herein, a description has been giving assuming that the timing adjustment capacitive element 15 is externally installed between the output terminal 5a of the first driver circuit 51a and the output terminal 5b of the second driver circuit 51b, but the timing adjustment capacitive element 15 may also be formed integrally with the first driver circuit 51a and second driver circuit 51b in an integrated circuit, as shown in FIG. 5. In this case, the gate resistor 8a corresponding to the IGBT 6 and the gate resistor 8b corresponding to the MOSFET 7 can, of course, be formed in an integrated circuit with the first driver circuit 51a and second driver circuit 51b.

Furthermore, a configuration can also be such that a switch 17 acting as a fifth switch circuit is provided in advance between the output terminal 5b and timing adjustment capacitive element 15, and the timing adjustment capacitive element 15 is selectively interposed between the output terminals 5a and 5b in accordance with the method of driving the first and second driver circuits 51a and 51b. Furthermore, when three or more semiconductor switching elements connected in parallel are driven by driver circuits corresponding one each to the semiconductor switching elements, the turn-on and turn-off timings of each semiconductor switching element can be adjusted by the timing adjustment capacitive element 15 being interposed in each space between output terminals of the driver circuits.

In each of the heretofore described embodiments, the drive voltages that turn the first and second semiconductor switching elements on and off may be such that the drive voltage that turns the first semiconductor switching element on is higher than the drive voltage that turns the second semiconductor switching element on. Also, conversely, the drive voltage that turns the first semiconductor switching element on may be lower than the drive voltage that turns the second semiconductor switching element on.

The semiconductor switching device that is the object of the invention is such that an impedance element, the timing adjustment resistor, the timing adjustment capacitive element, and the gate resistors of the IGBT and MOSFET that are the first and second semiconductor switching elements, with the IGBT and MOSFET as one module, make up circuits that drive the IGBT and MOSFET in the module as a drive IC.

In each of the heretofore described embodiments, the impedance element, the timing adjustment resistor, the timing adjustment capacitive element, and the gate resistors of the IGBT and MOSFET that are the first and second semiconductor switching elements can be formed in the drive IC, or can be formed on the elements on which the IGBT and MOSFET are formed.

The invention, not being limited to the heretofore described embodiments, can be changed in various ways without departing from the scope of the invention.

What is claimed is:

1. A semiconductor switching device, comprising:
a switching circuit unit configured to turn on and off a main current in a circuit, the switching circuit including a plurality of kinds of semiconductor switching elements having different turn-on/turn-off operation characteristics, the plurality of kinds of semiconductor switching elements connected in parallel;
a driver circuit that includes a current source terminal and a current sink terminal, the driver circuit configured to output a first drive voltage to turn on each of the semiconductor switching elements from the current source terminal in accordance with a control signal that controls the turning on and off of the main current, the driver circuit configured to output a second drive voltage that turns off each of the semiconductor switching elements from the current sink terminal in accordance with the control signal; and
an impedance element located between the current source terminal and the current sink terminal in the driver circuit, the impedance element configured to cause the semiconductor switching elements to be turned on and off at different times from each other,
wherein the plurality of kinds of semiconductor switching elements includes a first transistor including an insulated-gate bipolar transistor (IGBT) and a second transistor, and
wherein the impedance element is configured to turn on the second transistor before turning on the IGBT and to turn off the second transistor after turning off the IGBT.

2. The semiconductor switching device according to claim 1, wherein the driver circuit includes a first output switch circuit configured to output the first drive voltage from the current source terminal in accordance with the control signal and a second output switch circuit configured to output the second drive voltage from the current sink terminal in accordance with the control signal.

3. The semiconductor switching device according to claim 1, wherein the second transistor is a metal-oxide-semiconductor field-effect transistor (MOSFET).

4. The semiconductor switching device according to claim 1, wherein the first drive voltage is a high potential gate drive voltage necessary in order to turn on the plurality of kinds of semiconductor switching elements, and the second drive voltage is a low potential gate drive voltage lower than the first drive voltage and is necessary in order to turn off the plurality of kinds of semiconductor switching elements.

5. A semiconductor switching device, comprising:
a switching circuit unit including, in parallel, first and second semiconductor switching elements having different turn-on/turn-off operation characteristics, the switching circuit configured to turn on and off a main current;
a driver circuit including a current source terminal and a current sink terminal, the driver circuit configured to output a first drive voltage that turns on each of the first and second semiconductor switching elements from the current source terminal in accordance with a control signal that controls the turning on and off of the main current, and the driver circuit configured to output a second drive voltage that turns off each of the first and second semiconductor switching elements from the current sink terminal in accordance with the control signal; and
a timing adjustment resistance element located between the current source terminal and the current sink terminal in the driver circuit, the timing adjustment resistance element configured to cause the first and second semiconductor switching elements to be turned on and off at different times from each other,
wherein the first semiconductor switching element is an insulated-gate bipolar transistor (IGBT), and
wherein the timing adjustment resistance element is configured to turn on the second semiconductor switching element before turning on the IGBT and to turn off the second semiconductor switching element after turning off the IGBT.

6. The semiconductor switching device according to claim 5, wherein the second switching elements is a MOSFET.

7. The semiconductor switching device according to claim 5, wherein the driver circuit includes a first output switch circuit configured to output the first drive voltage to the current source terminal in accordance with the control signal, and
a second output switch circuit configured to output the second drive voltage, in an opposite manner to the first output switch circuit, to the current sink terminal in accordance with the control signal.

8. The semiconductor switching device according to claim 5, wherein the first drive voltage is a high potential gate drive voltage necessary in order to turn on the first and second semiconductor switching elements, and the second drive voltage is a low potential gate drive voltage which is lower than the first drive voltage and is necessary in order to turn off the first and second semiconductor switching elements.

9. The semiconductor switching device according to claim 5, wherein the driver circuit includes a first output switch circuit configured to output the first drive voltage to the current source terminal in accordance with the control signal,
a second output switch circuit configured to output the second drive voltage, in an opposite manner to the first output switch circuit, to the current sink terminal in accordance with the control signal, and
a third output switch circuit configured to output the second drive voltage, in the opposite manner to the first output switch circuit, to the current source terminal in accordance with the control signal.

10. The semiconductor switching device according to claim 9, wherein the third output switch circuit is configured to output the second drive voltage to the current source terminal before the first semiconductor switching element is turned off with outputting of the second drive voltage from the current sink terminal.

11. The semiconductor switching device according to claim 9, wherein the third output switch circuit is configured to output the second drive voltage from the current source terminal after the first semiconductor switching element is turned off with turning on of the second output switch circuit, thereby maintaining the first semiconductor switching element in an off-state.

12. A semiconductor switching device, comprising:
a switching circuit unit including, in parallel, first and second semiconductor switching elements having different turn-on/turn-off operation characteristics and turns a main current on and off;
a first driver circuit that configured to output a drive voltage that turns the first semiconductor switching element on and off from a first output terminal in accordance with a control signal that controls the turning on and off of the first and second semiconductor switching elements;
a second driver circuit that configured to output a drive voltage that turns the second semiconductor switching element on and off from a second output terminal in accordance with the control signal; and
a timing adjustment capacitive element located between the first output terminal included in the first driver circuit and the second output terminal included in the second driver circuit, the timing adjustment capacitive element configured to cause the first and second semiconductor switching elements to be turned on and off at different times from each other,
wherein the first semiconductor switching element is an insulated-gate bipolar transistor (IGBT), and
wherein the timing adjustment capacitive element is configured to turn on the second semiconductor switching element before turning on the IGBT and to turn off the second semiconductor switching element after turning off the IGBT.

13. The semiconductor switching device according to claim 12, wherein
the first driver circuit includes a first switch circuit configured to output a first drive voltage necessary in order to turn on the first semiconductor switching element from the first output terminal in accordance with the control signal, and a second switch circuit configured to output a second drive voltage necessary in order to turn off the first semiconductor switching element from the first output terminal in place of the first drive voltage, and
the second driver circuit including a third switch circuit configured to output a third drive voltage necessary in order to turn on the second semiconductor switching element from the second output terminal in accordance with the control signal, and a fourth switch circuit configured to output a fourth drive voltage necessary in order to turn off the second semiconductor switching element from the second output terminal in place of the third drive voltage.

14. The semiconductor switching device according to claim 13, wherein the first drive voltage is a high potential gate drive voltage necessary in order to turn on the first semiconductor switching element,
the second drive voltage is a low potential gate drive voltage which is lower than the first drive voltage and is necessary in order to turn off the first semiconductor switching element,
the third drive voltage is a high potential gate drive voltage necessary in order to turn on the second semiconductor switching element, and
the fourth drive voltage is a low potential gate drive voltage which is lower than the third drive voltage and is necessary in order to turn off the second semiconductor switching element.

15. The semiconductor switching device according to claim 13, wherein the third switch circuit is configured to output the third drive voltage to the output terminal of the second driver circuit via a backflow preventing diode that prevents a backflow of a charge accumulated in the timing adjustment capacitive element.

16. The semiconductor switching device according to claim 13, further comprising a fifth switch circuit configured to selectively cut off the timing adjustment capacitive element from between the output terminals of the first and second driver circuits.

17. The semiconductor switching device according to claim 12, wherein the second semiconductor switching element is a MOSFET.

18. A semiconductor switching device, comprising:
switching circuit unit including, in parallel, first and second semiconductor switching elements having different turn-on/turn-off operation characteristics, the switching circuit configured to turn on and off a main current;
a driver circuit including a current source terminal and a current sink terminal, the driver circuit configured to output a first drive voltage that turns on each of the first and second semiconductor switching elements from the current source terminal in accordance with a control signal that controls the turning on and off of the main current, and the driver circuit configured to output a second drive voltage that turns off each of the first and second semiconductor switching elements from the current sink terminal in accordance with the control signal; and
a timing adjustment resistance element located between the current source terminal and the current sink terminal in the driver circuit, the timing adjustment resistance element configured to cause the first and second semiconductor switching elements to be turned on and off at different times from each other,
wherein the driver circuit includes a first output switch circuit configured to output the first drive voltage to the current source terminal in accordance with the control signal,
a second output switch circuit configured to output the second drive voltage, in an opposite manner to the first output switch circuit, to the current sink terminal in accordance with the control signal, and
a third output switch circuit configured to output the second drive voltage, in the opposite manner to the first output switch circuit, to the current source terminal in accordance with the control signal.

19. The semiconductor switching device according to claim 18, wherein one of the first and second switching elements is an IGBT, and the other is a MOSFET.

20. The semiconductor switching device according to claim 18, wherein the third output switch circuit is configured to output the second drive voltage to the current source terminal before the first semiconductor switching element is turned off with outputting of the second drive voltage from the current sink terminal.

21. The semiconductor switching device according to claim 18, wherein the third output switch circuit is configured to output the second drive voltage from the current source terminal after the first semiconductor switching element is turned off with turning on of the second output switch circuit, thereby maintaining the first semiconductor switching element in an off-state.

22. A semiconductor switching device, comprising:
a switching circuit unit including, in parallel, first and second semiconductor switching elements having different turn-on/turn-off operation characteristics and turns a main current on and off;
a first driver circuit that configured to output a drive voltage that turns the first semiconductor switching element on and off from a first output terminal in accordance with a control signal that controls the turning on and off of the first and second semiconductor switching elements;
a second driver circuit that configured to output a drive voltage that turns the second semiconductor switching element on and off from a second output terminal in accordance with the control signal; and
a timing adjustment capacitive element located between the first output terminal included in the first driver circuit and the second output terminal included in the second driver circuit, the timing adjustment capacitive element configured to cause the first and second semiconductor switching elements to be turned on and off at different times from each other,
wherein the first driver circuit includes a first switch circuit configured to output a first drive voltage necessary in order to turn on the first semiconductor switching element from the first output terminal in accordance with the control signal, and a second switch circuit configured to output a second drive voltage necessary in order to turn off the first semiconductor switching element from the first output terminal in place of the first drive voltage, and
the second driver circuit including a third switch circuit configured to output a third drive voltage necessary in order to turn on the second semiconductor switching element from the second output terminal in accordance with the control signal, and a fourth switch circuit configured to output a fourth drive voltage necessary in order to turn off the second semiconductor switching element from the second output terminal in place of the third drive voltage.

23. The semiconductor switching device according to claim 22, wherein the first semiconductor switching element is an IGBT, and the second semiconductor switching element is a MOSFET.

24. The semiconductor switching device according to claim 22, wherein the first drive voltage is a high potential gate drive voltage necessary in order to turn on the first semiconductor switching element,
the second drive voltage is a low potential gate drive voltage which is lower than the first drive voltage and is necessary in order to turn off the first semiconductor switching element,
the third drive voltage is a high potential gate drive voltage necessary in order to turn on the second semiconductor switching element, and
the fourth drive voltage is a low potential gate drive voltage which is lower than the third drive voltage and is necessary in order to turn off the second semiconductor switching element.

25. The semiconductor switching device according to claim 22, wherein the third switch circuit is configured to output the third drive voltage to the output terminal of the second driver circuit via a backflow preventing diode that prevents a backflow of a charge accumulated in the timing adjustment capacitive element.

26. The semiconductor switching device according to claim 22, further comprising a fifth switch circuit configured to selectively cut off the timing adjustment capacitive element from between the output terminals of the first and second driver circuits.

* * * * *